United States Patent [19]

Liu et al.

[11] Patent Number: 5,124,666
[45] Date of Patent: Jun. 23, 1992

[54] CMOS CURRENT CONVEYOR AND ITS FILTER APPLICATIONS

[75] Inventors: Shen-Iuan Liu, Keelung; Jing-Shown Wu; Hen-Wai Tsao, both of Taipei, all of Taiwan

[73] Assignee: Industrial Technology Research Institute, Hsinchu, Taiwan

[21] Appl. No.: 664,608

[22] Filed: Mar. 4, 1991

[51] Int. Cl.$^5$ .............................................. H03F 3/45
[52] U.S. Cl. .................................. 330/253; 530/257; 530/288
[58] Field of Search .............. 330/253, 257, 294, 288; 307/353; 323/316

[56] References Cited

U.S. PATENT DOCUMENTS

| | | | |
|---|---|---|---|
| 3,582,689 | 6/1971 | Smith | 307/296.6 |
| 3,619,798 | 11/1971 | Smith | 330/295 |
| 4,030,043 | 6/1977 | Hamilton | 330/260 |
| 4,338,527 | 7/1982 | Nagano | 330/257 |
| 4,983,930 | 1/1991 | Wadsworth | 330/288 |
| 5,012,133 | 4/1991 | Hughes | 307/353 |
| 5,028,822 | 7/1991 | Hughes | 307/353 |
| 5,055,719 | 10/1991 | Hughes | 330/288 |

OTHER PUBLICATIONS

The Current Conveyor: History, Process and New Results, Sedra et al., IEEE Proceeding, vol. 137, No. 2, Apr. 1990.
Novel MOS Resistive Circuit for Synthesis of Fully Integrated Continuous-Time Filters, Czarnul, IEEE, vol. CAS-33, No. 7, Jul. 1986.

Primary Examiner—Eugene R. LaRoche
Assistant Examiner—Tan Dinh
Attorney, Agent, or Firm—Hung Chang Lin

[57] ABSTRACT

A CMOS second generation current conveyor (CCII) and its integrators suitable for MOS technology integrated circuit (IC) applications. Ladder filters based on CCII are realized. CMOS CCII-based circuits can be directly employed in single CCII biquad filters. Four configurations are proposed to synthesize various types of second-order transfer functions.

27 Claims, 11 Drawing Sheets

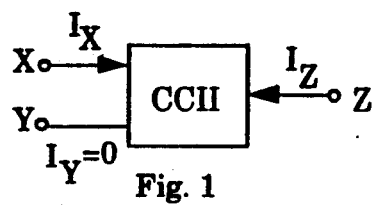 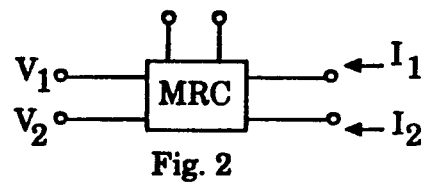
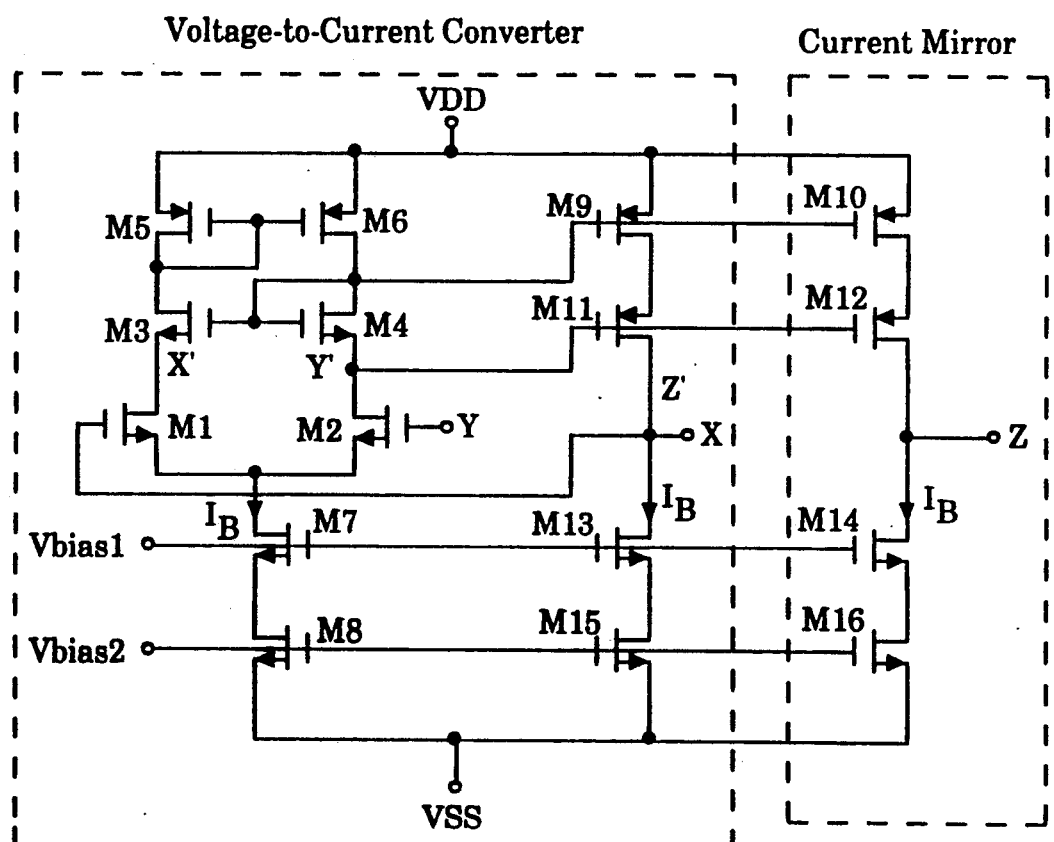
Fig. 3(a)

CMOS CURRENT CONVEYOR AND ITS FILTER APPLICATIONS

FIELD OF THE INVENTION

This invention relates to circuits and filters suitable for MOS technology and active RC networks, especially for use in analog signal processing employing current conveyors.

BACKGROUND

Monolithic continuous-time MOSFET-capacitor circuits has been employed in MOS technology for analog signal processing to tolerate the process and temperature variations. However, continuous-time MOSFET-capacitor circuits are accomplished through the use of feedback around a high voltage gain operational amplifier (op amp) to achieve a well-defined voltage transfer function which is insensitive to the characteristics variation of active devices. Unfortunately, the voltage controlled op amp has several limitations which prevent high performance operation. One of the limitations is that the product of the bandwidth and the voltage gain is approximately constant. Hence, the operating frequency range of the conventional voltage op-amp based circuits is inevitably limited.

The advantages of using conveyors are high slew rate and wide bandwidth. The symbol for a current conveyor is shown in FIG. 1. There are first generation (Class I) current conveyors (CCI) and second generation (Class II) current conveyors (CCII). In CCI, equal voltages Vx and Vy appear at the X and Y terminals, and equal currents Ix and Iy flow through these two terminals respectively. The current supplied to the X terminal is conveyed to the the output terminal Z as Iz.

CCII was developed to increase the versatility of CCI in that there is no current flow in the Y terminal i.e., the Y terminal has high impedance.

A CMOS version of the CCII was reported by A. S. Sedra et.al. in "The current conveyor: history, progress and new results", IEE Proceedings, Vol. 137, Pt.G., No.2, April, 1990, pp. 78-87. In Sedra's paper, the high impedance at the Y terminal is achieved by using a separate op amp as a voltage follower. Op amps generally suffers from poor frequency response and requires relatively large capacitor as an integrator.

Another problem in continuous time IC filter design is the resistance. Resistance in IC generally cannot be controlled accurately and occupies relatively large area. If an MOSFET is used as a resistor, the voltage-current characteristic is nonlinear (or non-ohmic).

In a paper "Novel MOS resistive Circuit for synthesis of fully integrated continuous-timefilters", published in the IEEE Transactions on Circuits and Systems, Vol. CAS-33, July, 1985, pp-718-720, Z. Czarnul proposed using matched MOSFETs to replace linear resistance for continuous-time operation, and named such circuits as MOS resistive circuit (MRC). The symbol for an MRC is shown in FIG. 2. There are two voltage inputs V1 and V2; two output currents I1 and I2; two control voltages VG1 and VG2. The relationship among them is:

$$I1 - I2 = 2K(VG1 - VG2)(V1 - V2) \quad (1)$$

where K is a proportionality constant. The advantage of such a circuit is that no ohmic resistance need be fabricated in an IC structure. However, Czarnul's application has been limited to integrator using an op amp.

SUMMARY

The object of this invention is to implement a second generation current conveyor which satisfies the ideal CCII characteristics. Another object of this invention is to realize a CCII without using an operational amplifier. Still another object of this invention is to implement a CCII using CMOS technology for integrated circuits. A further object of this invention is to use the CMOS CCII to implement different kinds of continuous time filters, including biquads, ladder filters, and various types of second-order transfer functions.

These objects are achieved in this invention by using a CMOS voltage-to-current converter and a current mirror to realize the CCII. The voltage-to-current converter uses a differential MOSFET pair to serve as the X and Y inputs and to drive a first generation current conveyor. The differential pair cancels the nonlinearity of the MOSFET characteristics and eliminates the use of separate op amp. The voltage-to-current converter drives a current mirror to become a CCII. The CCIIs are then combined with MRCs to implement different kinds of filters, including integrators, biquads, ladder filters and various types of second order transfer functions.

BRIEF DESCRIPTION OF THE DRAWINGS

FIG. 1 shows the current conveyor symbol.

FIG. 2 shows the symbol of an MOS resistive circuit MRC.

FIG. 3(a) shows a simplified CMOS CCII+ circuit.

DETAILED DESCRIPTION OF THE PREFERRED EMBODIMENT

Figure 3B:
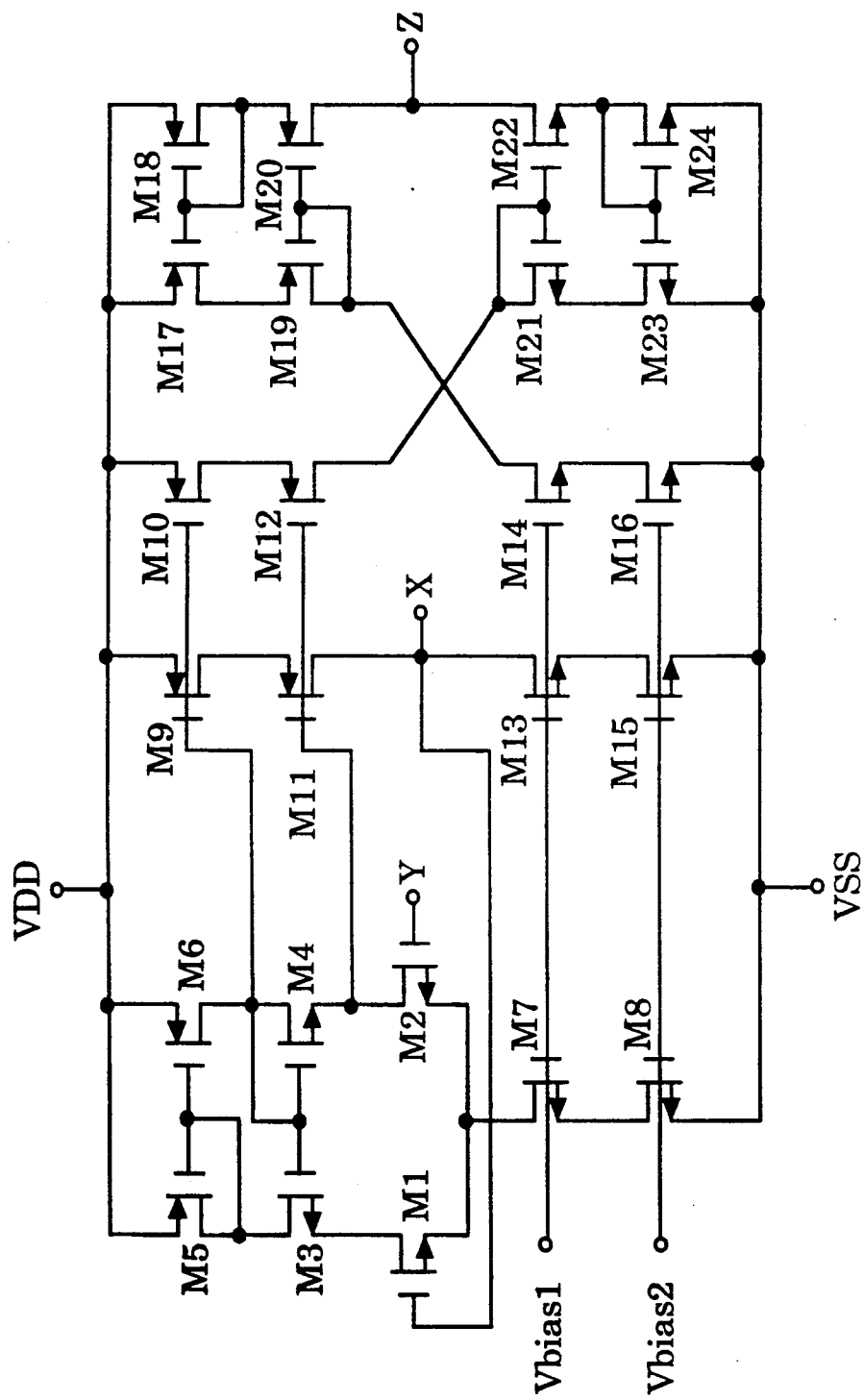
FIG. 3(b) shows a simplified CMOS− circuit.

Basically, a CCII is a three port network having the terminal characteristic described by matrix equation $$\begin{vmatrix} I_y \\ V_x \\ I_z \end{vmatrix} = \begin{vmatrix} 0 & 0 & 0 \\ 1 & 0 & 0 \\ 0 & \pm k & 0 \end{vmatrix} \begin{vmatrix} V_y \\ I_x \\ V_z \end{vmatrix} \quad (2)$$

where the plus and minus signs of the current transfer ratio k denote positive current conveyor CCII+ and negative current conveyor CCII-respectively. Various methods can be used to implement a CMOS CCII. A possible realization is shown in FIG. 3 (a) and 3(b). Consider the positive current conveyor CCII+, shown in FIG. 3(a), which consists of a voltage-to-current converter mirror. Since the input impedance of a MOSFET is high, one can assume the input current Iy is zero. Let the dc currents in the three identical current sources be composed of MOSFETs (M7,8), (M13,15), and (M14,16), respectively be IB. When there is a small signal current Ix flowing out of Port * X, the voltage follower will force the currents of M9 and M11 to be IB+Ix and Vx=Vy. Meanwhile, the current mirror M10 and M12 copies the same current IB+Ix. Hence, the Port Z has a current Iz which is equal to IX. In general, if the aspect ratios, i.e., width to length ratio W/L, of transistors connected to Port Z is k times of those transistors connected to Port X, then Iz=k Ix. The operation principle of a negative current conveyor CCII- is similar to that of the CCII+ except another mirror must be added to invert the polarity of the current Iz as shown in FIG. 3(b).

In FIG. 3(b). all the current sources are "cascode current sources". In each cascode current source, two MOSFETs, such as M7 and M8, are connected in cascade. The VBIAS2 controls the drain current and VBIAS1 clamps the drain voltage of M8 to a low voltage and increases the output impedance of M7 to approach an ideal current source. The range of VBIAS1 should be chosen to operate M8 in the current saturation region to obtain high output impedance. Thus, for the cascode current source M9 and M11, the gate biasing voltage for M11 is illustrated to be connected to a convenient voltage at the drain of M2, although any other convenient biasing voltage may also be used.

For the biasing voltage of M9, FIG. 3(b) shows a connection to the gate of M3. However, due to symmetry of the p-channel MOSFET current M5, M6 and the n-channel MOSFET current mirror M3, M4, the gate voltage of M3 and M6 should be the same. Therefore, the gate of M9 may also be connected to the gate of M6.

Figure 4A:
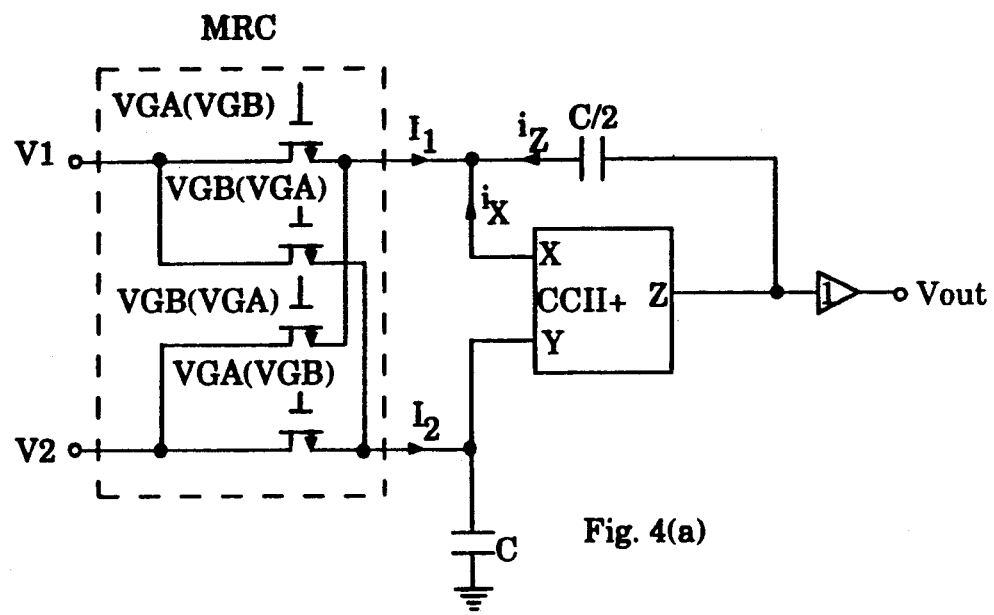
FIG. 4(a) shows the circuit diagram of a type A integrator.
Figure 4B:
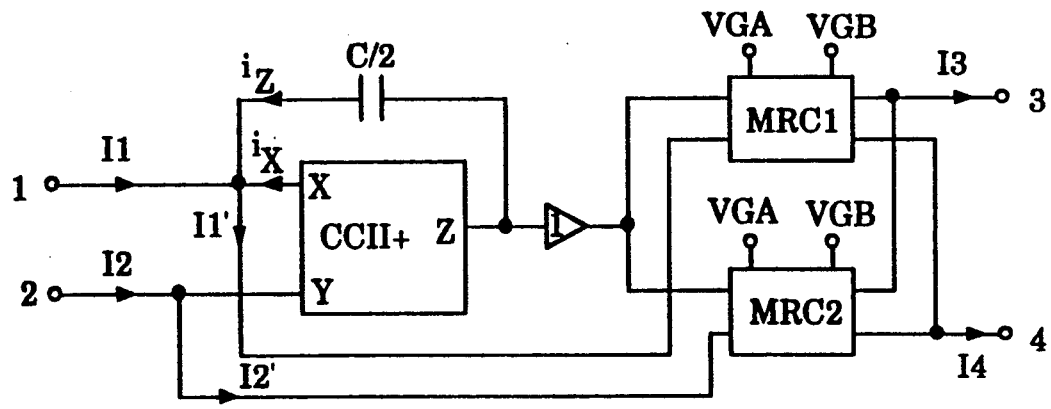
FIG. 4(b) shows the circuit diagram of a type B integrator.
Figure 4C:
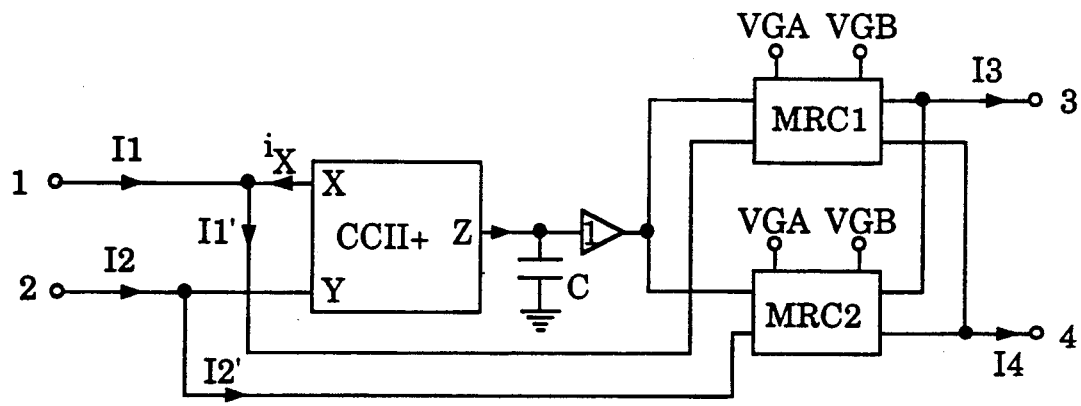
FIG. 4(c) shows the circuit diagram of a typr C integrator.

Based on the current conveyors, three MOSFET-capacitor integrators as shown in FIG. 4(a), 4(b) and FIG. 4(c) are proposed and explained as follows:

For an NMOS transistor biased in the triode region, the dc channel current in terms of several basic MOSFET parameters is:

$$I_D = F(V_D, V_G) - F(V_S, V_G) \quad (3)$$

where $$F(V_X, V_G) = 2K(V_G - V_B - V_{FB} - \phi_B)V_X - K(V_X - V_B)^2 - \frac{4}{3} K\gamma(V_X - V_B + \phi_B)^{2/3}$$

-continued $$K = \frac{W}{2L} \mu C_{ox}$$

$$\gamma = \frac{1}{C_{ox}} (2qN_A\epsilon_s)^{1/2}$$

it has been shown that the MOS resistive circuit (MRC), shown in FIG. 4(a), can completely cancel the even and odd mode nonlinearities. In the following analysis, it is assumed that all the transistors in the MRC have the same aspect ratio W/L and operate in the triode region.

For the type A integrator shown in FIG. 3(a), one can obtain the output current difference of the MRC using eq. (3) as $$\begin{aligned} I_1 - I_2 &= F(V_1, V_{GA}) - F(V_1, V_{GB}) + F(V_2, V_{GB}) - F(V_2, V_{GA}) \\ &= 2K(V_{GA} - V_{GB})(V_1 - V_2) \end{aligned} \quad (4)$$

Further, the output voltage of the type A integrator can be expressed as $$V_{out} = V_x + \frac{2}{C} \int i_z \, d\tau \quad (5)$$

and $$V_y = \frac{1}{C} \int I_2 \, d\tau \quad (6)$$

Applying Kirchoff's current law, KCL at Port X, one can obtain $$i_z = -\frac{I_1}{2} \quad (7)$$

Therefore, substituting eqs. (4), (6), and (7) into eq. (5), the output voltage is given by $$V_{out} = \frac{1}{RC} \int V_{in} \, d\tau \quad (8)$$

where $$R = \pm \frac{1}{\mu C_{ox} \frac{W}{L} (V_{GA} - V_{GB})} \quad (9)$$

and $$V_{in} = V_1 - V_2$$

In FIG. 4(a), the gate voltages outside the parentheses apply to an inverting integrator to obtain an output voltage at the Z terminal, whereas those inside the parenthesis apply to a noninverting integrator to obtain an output voltage inverted by the inverter 1.

For the type B integrator shown in FIG. 4(b), the output current difference I3−I4 of the type B integrator can be derived from eq. (1) as $$I_3 - I_4 = 2K(V_{GA} - V_{GB})(V_2 - V_x) \quad (10)$$

where Vz is obtained by inverting the signal at Z.

Figure 5A:
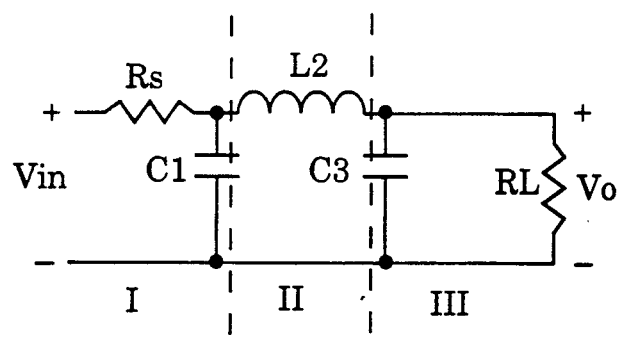
FIG. 5(a) shows the prototype of a third-order low-pass ladder filter.
Figure 5B:
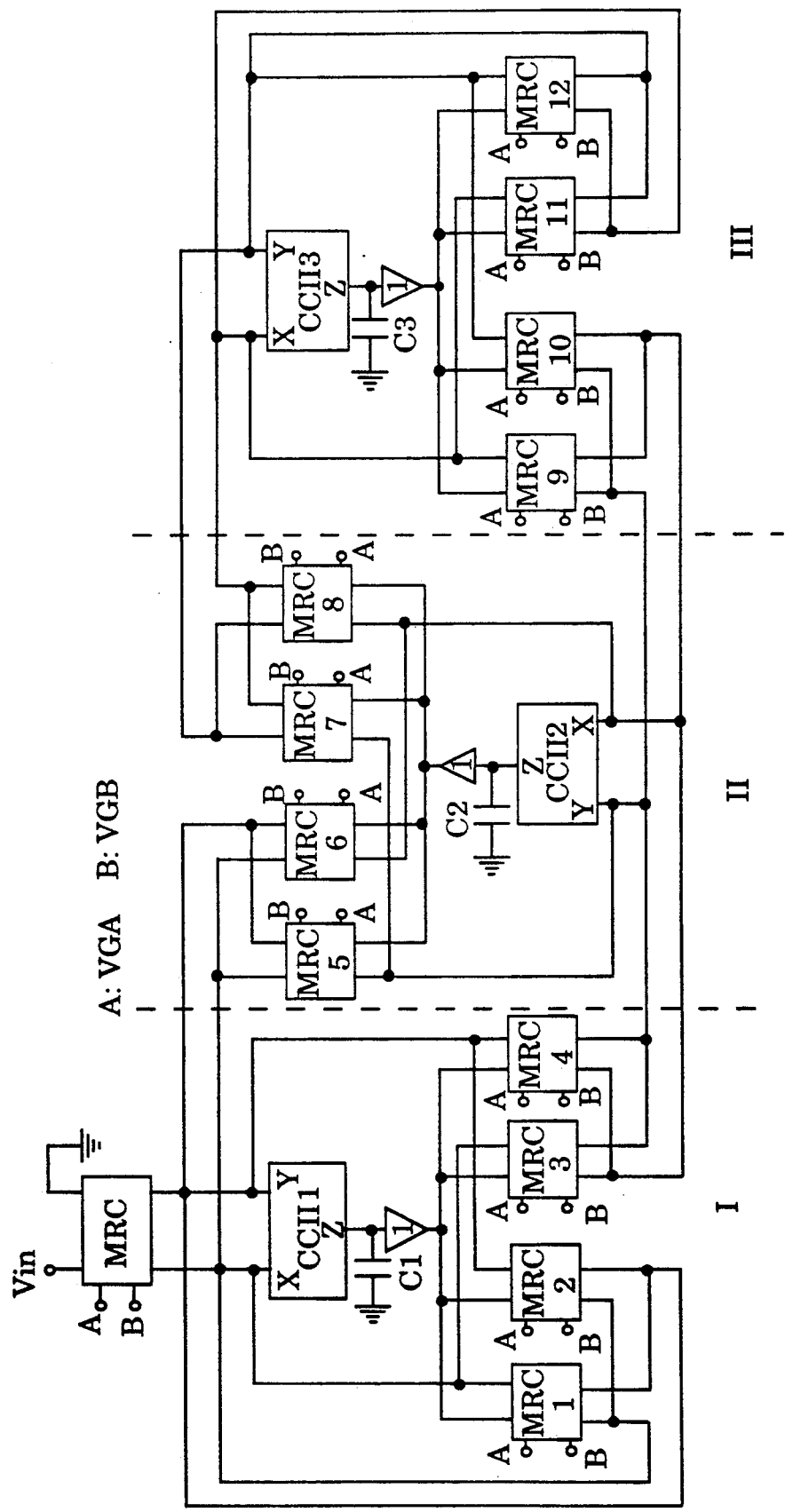
FIG. 5(b) shows the circuit of a third-order ladder filter constructed with type C integrators.

The current Iz flowing into the capacitor in FIG. 5(b) is $$I_z = (I_1 - I_1')/2 \quad (11)$$

Because there is no current flowing into Port Y, we have $$I_2 = I_2' \quad (12)$$

Since the two identical MRC's are under the same bias condition, $$I_1' = I_2' \quad (13)$$

Substituting eq. (11) and (12) into the eq. (10), then one obtains $$I_z = (I_1 - I_2)/2 \quad (14)$$

Therefore, the output voltage of the type B integrator is $$V_z = V_x - \frac{1}{C} \int (I_1 - I_2) \, d\tau \quad (15)$$

Further, the output current difference, $I_3 - I_4$, becomes $$I_3 - I_4 = -\frac{1}{RC} \int (I_1 - I_2) \, d\tau \quad (16)$$

where R is given in eq. (9).

Eq. (16) indicates that the output current difference $I_3 - I_4$ is proportional to the integration of the input current difference, $I_1 - I_2$.

In the same way, one can derive similar equations for the type C integrator, shown in FIG. 4(c), as $$V_z = -\frac{1}{C} \int (I_1 - I_2) \, d\tau \quad (17)$$

$$I_3 - I_4 = -\frac{1}{RC} \int (I_1 - I_2) \, d\tau \quad (18)$$

These three integrators have different advantages relative to each other. It is of interest to note that if the total area of the MRCs of the integrator is fixed, the type B integrator requires half the capacitance 2C which is needed in the original implementation. Moreover, if $I_z = I_x/n$ then the capacitance can be reduced by n times. The same principle can also be applied in the type A and B integrators. The type C integrator offers a particular advantage because all the capacitors are grounded. Since the type C integrator does not utilize feedback, it is therefore possible to operate the CCII+ up to its unity-gain frequency.

Utilizing the CCII and MOSFET-capacitor integrators, the filter applications can be classified in three different categories, i.e. ladder, single CCII biquad, and high input impedance single CCII biquad filters.

(1) Ladder filters (a) RLC lowpass ladder filter using CCIIs: Based on the above building blocks just illustrated, fully integrated continuous-time MOSFET-capacitor filters using CMOS CCIIs can be constructed. As an example, a third-order doubly-terminated low-pass ladder filter is designed. In this filter, the type C integrator is used as a basic building block and its output buffer employs a voltage follower. FIG. 5(a) illustrates a doubly terminated RLC low-pass filter prototype. Applying the well-known signal flow graph method, the corresponding MOSFET-capacitor filter using CCIIs as active elements is shown in FIG. 5(b).

In such a filter network, the resistance, capacitance and inductance can be simulated with CCIIs and MRCs. For the low-pass section $R_s C_1$, the basic transfer function is $$V_1 = \frac{V_{in}/sC_1}{R_s + 1/sC_1} \quad (19)$$

This equation can be rewritten as $$(V_{in} - V_1)/sC_1 = V_1 R_s \quad (19a)$$

This function is realized in the first section I of FIG. 5(b), and $(V_{in} - V_1)$ can be realized by recursive filter technique, feeding back V1 at the output of the $R_s C_1$ section. In FIG. 5(b), the input voltage Vin is first converted by an MRC into currents feeding CCII1. CCII1, C1 and MRC1, MRC2 form a type C integrator as explained in FIG. 4(c). The output currents of MRC1 and MRC2 correspond to V1 and fed back to the input of CCII1 to perform the $V_{in} - V_1$ function.

The output currents of MRC3 and MRC4 also correspond to V1. The current in the inductor L3 of FIG. 5(a) should have a current $$I_3 = (V_1 - V_o)/sL \quad (20)$$

The circuit implementation of this function is shown in Section II of FIG. 5(b) using Type C integrator shown in FIG. 4(c). The value of C2 is chosen to correspond with the value of L.

The last section III of FIG. 5(a) is another $R_L C_3$ low-pass section with a transfer function $$V_o = I_3/(sC_3 + 1/R_L) \quad (21)$$

This equation can be rewritten as $$I_o = \frac{I_3 - V_o/R_L}{sC_3} \quad (21a)$$

This equation can again be implemented with an integrator, as shown in section III of FIG. 5(b). With a current $V_o/R_L$ fed back to the input of section III to yield $I_L - V_o/R_L$.

Using the method just illustrated, any ladder filter can be realized with CCIIs and MRCs.

Figure 6A:
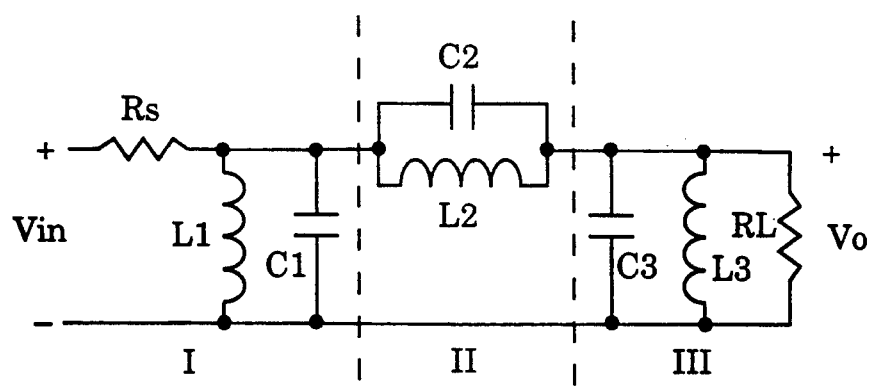
FIG. 6(a) shows the prototype of a sixth-order low-pass ladder filter.

(b) RLC band-pass ladder filter using CCIIs: A sixth-order bandpass ladder filter has also been designed using the type A integrators. The RLC filter prototype is shown in FIG. 6(a) and its corresponding MOSFET-capacitor filter using the type A integrators is given in FIG. 7(b).

For this filter, parallel LC networks are present. The circuit can be devided into three sections I, II, III. Section I consists of $R_s$ in series with parallel $C_1$ and $L_1$. The Thevenin equivalent voltage $V_1$ for this section is $$V_1 = \frac{V_{in}}{1 + sC_1 R_s + R_s/sL_1} \quad (22)$$

which can be rewritten as $$V_1 = \frac{V_{in} - V_1}{sC_1 R_s} - \frac{V_1}{s^2 L_1 C_1} \quad (22a)$$

The first term in the right-hand side of this equation can be realized by integrating (Vin−V$_1$) once. The quantity V$_1$ is fed back using recursive filter technique. The second term in the right-hand side of this equation can be realized by integrating V$_1$ twice. The circuit for implementing this equation is shown in section I of FIG. 6(b), where type A integrators of this invention are used. In this circuit, MRC2 supplies the feedback signal V$_1$, CCII1 performs the single integration and CCII2 performs the double integration.

The current through the parallel C2L2 section is related to the voltage across this parallel combination V$_1$−Vo by the following equation:

$$V_1 - V_o = \frac{I_2 sC_2}{1 + s^2 L_2 C_2} \quad (23)$$

which can be rewritten as $$\frac{I_2}{s} = \left(\frac{1}{s^2 C_2} + L_2\right)(V_1 - V_o) \quad (23a)$$

Figure 6B:
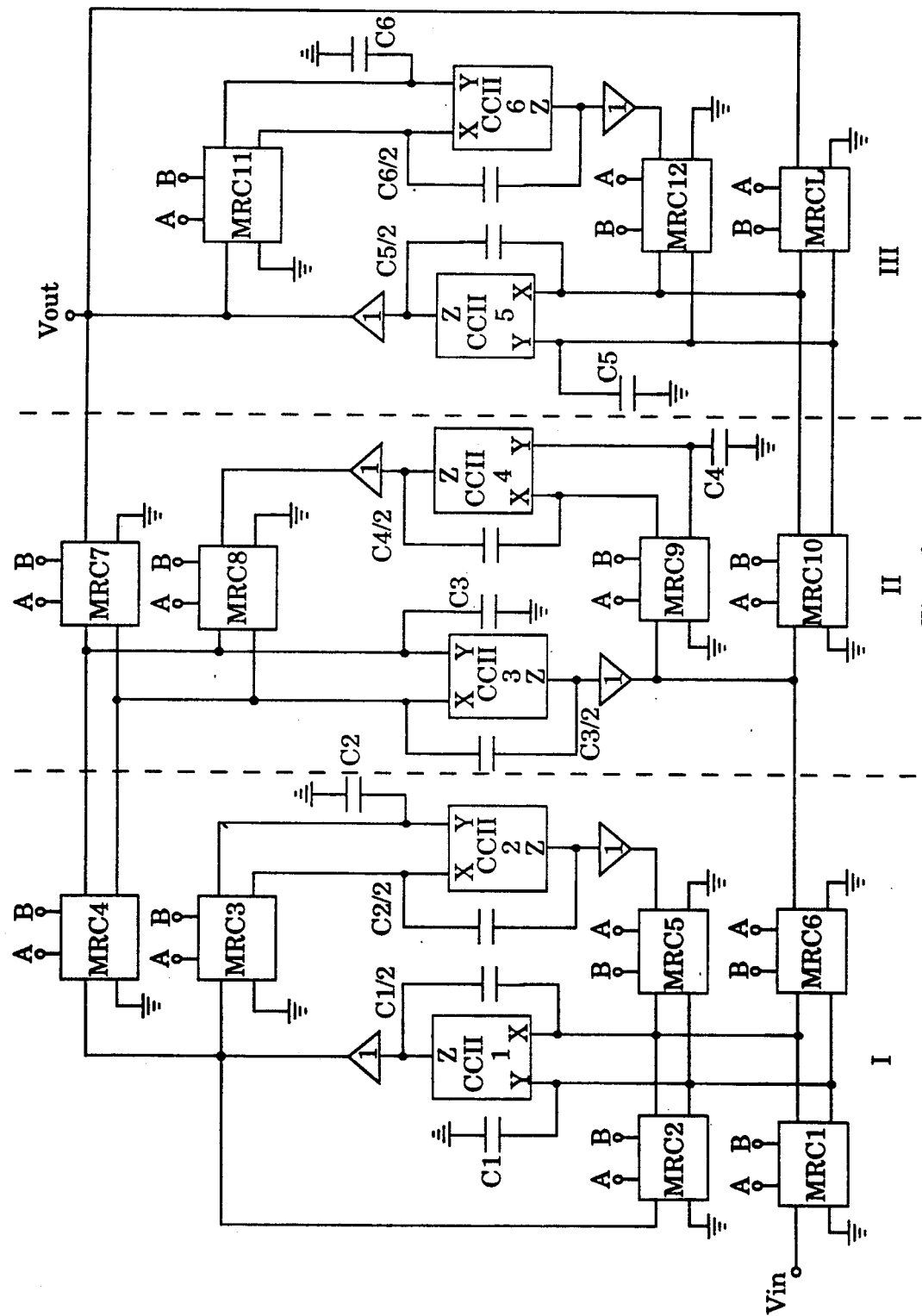
FIG. 6(b) shows the circuit of a sixth-order low-pass ladder filter constructed the type A integrators.

This equation is implemented in section II of FIG. 6(b). The double integration $1/s^2$ is implemented by two integrators including CCII3 and CCII4. The quantity Vo in the right-hand side is fed back recursively to the input side.

The voltage appearing across the parallel R$_L$L$_3$C$_3$ section III in FIG. 6(a) is related to the input current I$_2$:

$$V_o \left(\frac{1}{R_L} + \frac{1}{sL_3} + sC_3\right) = I_2 \quad (24)$$

which can be written as $$V_o = \frac{I_2}{sC_3} - \frac{V_o}{sR_L C_3} - \frac{V_o}{s^2 L_3 C_3} \quad (24a)$$

This equation involves single integration 1/s and double integration $1/s^2$. The circuit implementation of this equation using type A integrators and recursive technique is shown in section III of FIG. 6(b). This example illustrates that high order transfer functions can be implemented with integrators of this invention.

(2) Single CCII Biquad

Figure 7:
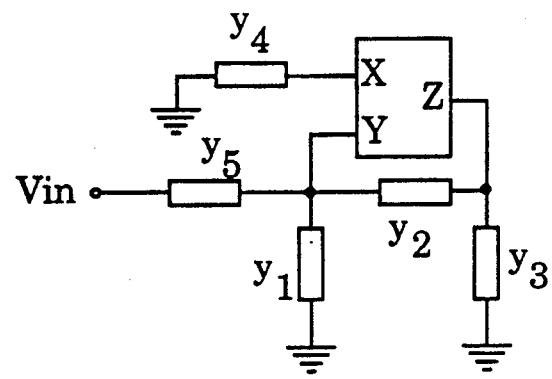
FIG. 7 shows the first configuration for the synthesis of a single-CCII-biquads.

Consider the first general configuration for single-CCII−biquads (SCBs) as given in FIG. 7 where the CCII is shown connected to five passive one-port RC networks. By applying the routine circuit analysis, one obtains the following transfer functions (assuming an ideal CCII, i.e. Iy=O, Iz==I, Vx=Vy)

$$\frac{V_z}{V_{in}} = \frac{y_5(y_3 + y_4)}{y_3 y_1 + y_3 y_5 + y_1 y_2 + y_2 y_3 + y_2 y_5 - y_3 y_4} \text{ for } CCII+ \quad (25)$$

$$\frac{V_z}{V_{in}} = \frac{y_5(y_3 - y_4)}{y_3 y_1 + y_3 y_5 + y_1 y_2 + y_2 y_3 + y_2 y_5 + y_3 y_4} \text{ for } CCII- \quad (26)$$

It can be seen that eqns. (25) and (26), expressed in terms of admittances, are able to perform various second-order voltage filtering operation, including low-pass LP, band-pass BP, high-pass HP, all-pass AP, and notch filter N functions.

For eqn. (26), if y$_1$=y$_2$=O (open circuit) and y$_3$=y$_5$, then the transfer function can be an all-pass AP or null or notch N function depending on the characteristics of y$_3$ and y$_4$. Thus eqn. (20) becomes $$\frac{V_z}{V_{in}} = \frac{y_3 - y_4}{y_3 + y_4} \quad (27)$$

Figure 8:
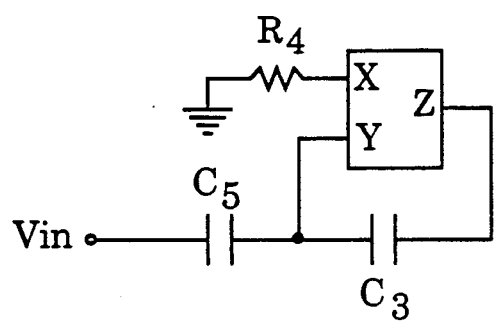
FIG. 8 shows the circuit realization for a first-order all-pass filter.
Figure 9:
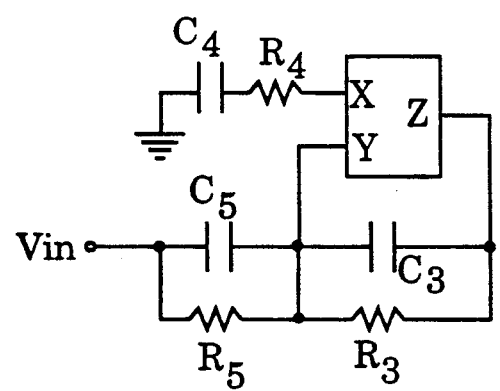
FIG. 9 shows the circuit realization for a notch biquad filter.

A first-order AP filter is implemented with y$_3$=sC$_3$ and y$_4$=i/R$_4$ as shown in FIG. 8. Another first-order AP can also be constructed with admittances y$_3$ and y$_4$ exchanged. FIG. 9 shows a notch filter which is constructed with y$_3$=sC$_3$+1/R$_3$ and y$_4$=1/(R$_4$+1/sC$_4$). By substituting y$_3$ and y$_4$ into eqn. (27), the transfer function becomes $$\frac{V_z}{V_{in}} = \frac{s^2 C_3 C_4 R_3 R_4 + s(C_3 R_3 + C_4 R_4 - C_4 R_3) + 1}{s^2 C_3 C_4 R_3 R_4 + s(C_3 R_3 + C_4 R_4 + C_4 R_3) + 1} \quad (28)$$

Let $$C_3 = C_4\left(1 - \frac{R_4}{R_3}\right) \quad (29)$$

Then a second-order notch filter can be realized. Because its output is of the same magnitude as the input, this circuit has no disadvantage of having a constant loss which needs an additional amplication stage in practical use. If the admittances y$_3$ and y$_4$ are exchanged, another notch filter can be realized. Other types of the second-order biquad filters using the configuration of FIG. 7 are summarized in Table 1.

Figure 10:
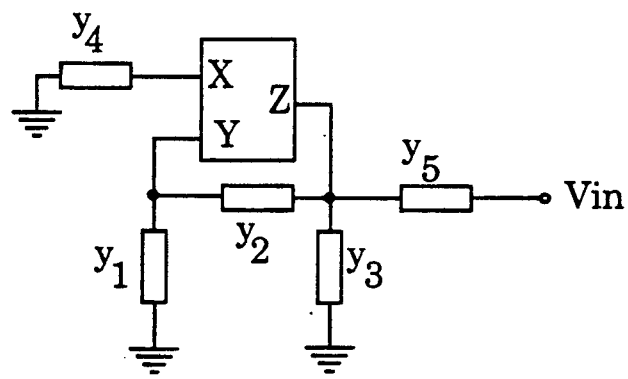
FIG. 10 shows the second configuration for the synthesis of a single-CCII-biquads.

A second general configuration for the SCBs is shown in FIG. 10. A simple circuit analysis leads to the following transfer functions (assuming an ideal CCII).

$$\frac{V_y}{V_{in}} = \frac{y_3 y_5}{y_3 y_1 + y_3 y_5 + y_1 y_2 + y_2 y_3 + y_1 y_5 - y_3 y_4} \text{ for } CCII+ \quad (30)$$

$$\frac{V_y}{V_{in}} = \frac{y_3 y_5}{y_3 y_1 + y_3 y_5 + y_1 y_2 + y_2 y_3 + y_1 y_5 - y_3 y_4} \text{ for } CCII- \quad (31)$$

Figure 11:
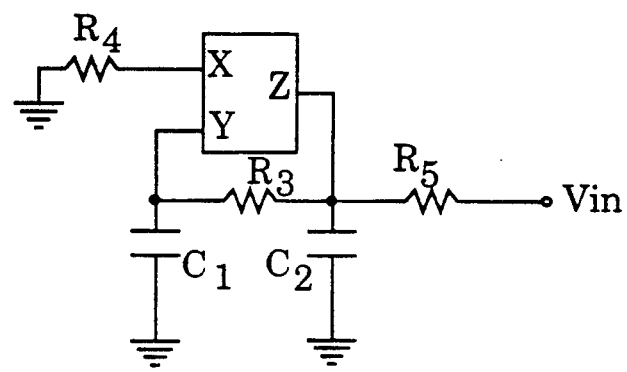
FIG. 11 shows the circuit realization for a low-pass biquad filter.

As an example, for eqn. (30), when y$_3$=1/R$_3$, y$_4$=1/R$_4$, y$_5$=1/R$_5$. y$_1$=sC$_1$, and y$_2$=sC$_2$, the resulting circuit, shown in FIG. 11, is a low-pass LP filter, with $$\omega_0 = \left(\frac{R_4 - R_5}{C_1 C_2 R_3 R_4 R_5}\right)^{\frac{1}{2}} \quad (32)$$

$$Q = \left(\frac{R_4 - R_5}{R_4}\right)^{\frac{1}{2}} \frac{(C_1 C_2 R_3 R_5)^{\frac{1}{2}}}{C_1 R_5 + C_1 R_3 + C_2 R_5} \quad (33)$$

and gain $H_{LP} = \frac{R_4}{R_4 - R_5} \quad (34)$

Figure 12:
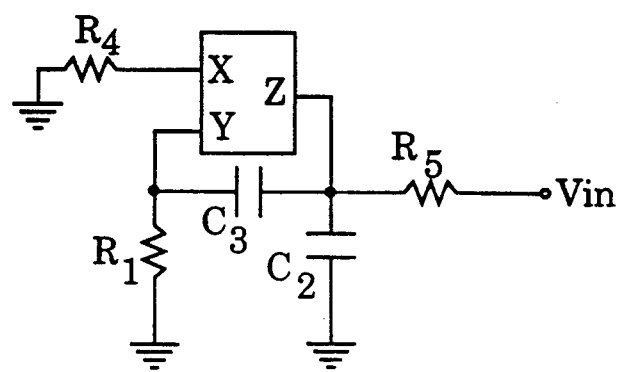
FIG. 12 shows the circuit realization for the band-pass biquad filter.

For instance in eqn. (30), when y$_3$=sC$_3$, y$_5$=1/R$_5$, y$_1$=1/R$_1$, y$_2$=sC$_2$, and y$_4$=1/R$_4$, this circuit, shown is FIG. 12, performs a band-pass BP function with $$\omega_0 = \left(\frac{1}{R_1 C_2 C_3 R_5}\right)^{\frac{1}{2}} \quad (35)$$

$$Q = \frac{(R_1C_2C_3R_5)^{\frac{1}{2}}}{R_5C_3 + R_5C_2 + R_1C_3 - C_3R_5R_1/R_4} \quad (36)$$

$$\text{and gain } H_{BP} = \frac{C_3R_1}{C_4R_5 + R_5C_2 + C_3R_1 - C_3R_5R_1/R_4} \quad (37)$$

Figure 13:
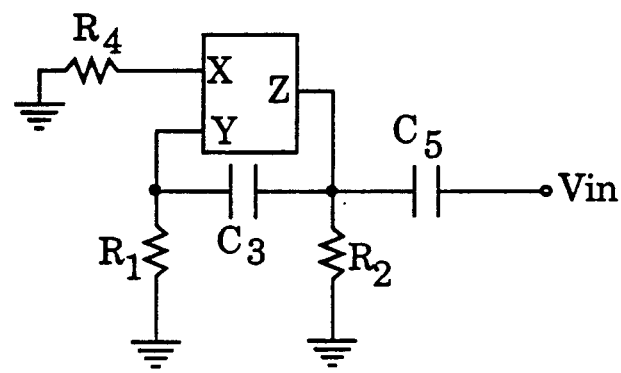
FIG. 13 shows the circuit realization for a high-pass biquad filter.

Similarly, for eqn. (30), if $y_3 = sC_3$, $y_5 = sC_5$, $y_1 = 1/R_1$, $y_2 = 1/R_2$, and $y_4 = 1/R_4$, as shown in FIG. 13, then the transfer function has a high-pass HP characteristic with $$\omega_0 = \left(\frac{1}{R_1R_2C_3C_5}\right)^{\frac{1}{2}} \quad (38)$$

$$Q = \frac{(R_1R_2C_3C_5)^{\frac{1}{2}}}{R_2C_3 + R_2C_5 + R_1C_3 - C_3R_1R_2/R_4} \quad (39)$$

and gain $H_{HP} = 1$

Other possible SCBs derived from from the second configuration are summarized in Table 2.

(3) High input impedance single CCII biquad

Figure 14B:
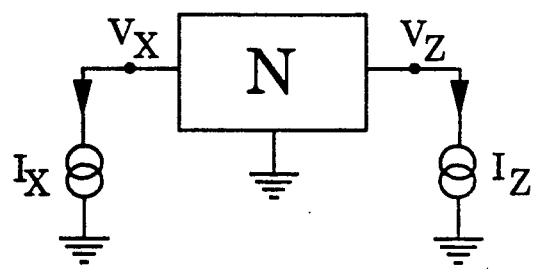
FIG. 14(b) shows the equivalent circuit of the FIG. 14(a).
Figure 14A:
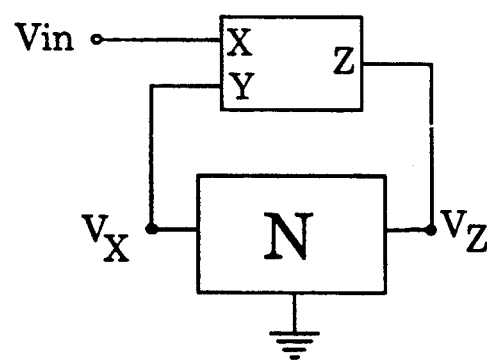
FIG. 14(a) shows the general configuration for a single CCII-biquad with high input impedance.

Consider a general configuration and its equivalent circuit are shown in FIG. 14(a) and 14(b), respectively. If the network N is described by the short-circuit admittance matrix of two port network, then the transfer function can be given as $$\frac{V_z}{V_x} = -\frac{ky_{11} + y_{21}}{y_{22} + ky_{12}} \text{ for } CCII- \quad (40)$$

$$\frac{V_z}{V_x} = -\frac{ky_{11} + y_{21}}{y_{22} + ky_{12}} \text{ for } CCII+ \quad (41)$$

where $y_{ij}$, $i = 1,2$, $j = 1,2$, are the elements of the admittance matrix.

Figure 15A:
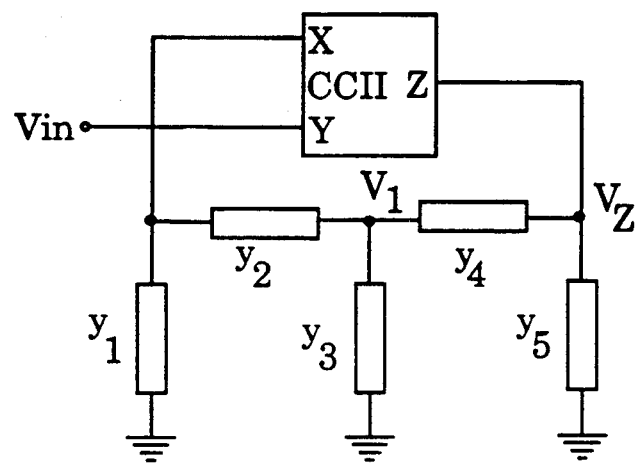
FIG. 15(a) shows the third configuration for a single-CCII biquad.
Figure 15B:
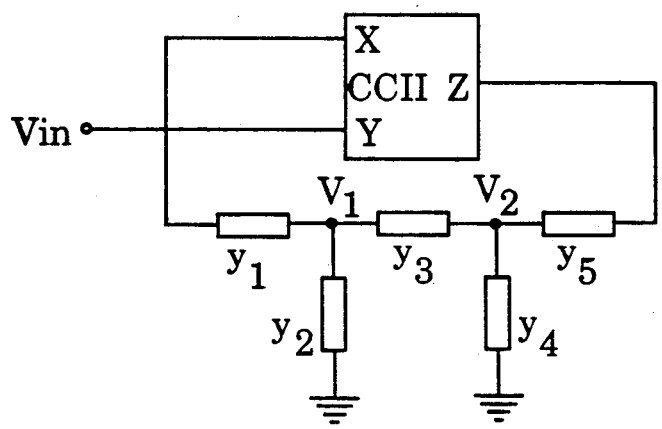
FIG. 15(b) shows the fourth configuration for a single-CCII biquad.

By appropriately choosing the network N, one can synthesize the desired filtering transfer functions. Two possible configurations of the passive RC network N with single CCII biquads SCBs are shown in FIG. 15(a) and FIG. 15(b). In the first configuration FIG. 15(a), $$\frac{V_1}{V_y} = \frac{y_1y_4 - y_2y_5}{y_5(y_2 + y_3 + y_4) + y_3y_4} \text{ for } CCII- \quad (42)$$

$$\frac{V_z}{V_y} = -\frac{y_1(y_2 + y_3 + y_4) + y_2y_3}{y_5(y_2 + y_3 + y_4) + y_3y_4} \text{ for } CCII- \quad (43)$$

$$\frac{V_1}{V_y} = \frac{y_1y_4 + y_2y_5 + 2y_2y_4}{y_5(y_2 + y_3 + y_4) + y_3y_4 + 2y_2y_4} \text{ for } CCII+ \quad (44)$$

Figure 16:
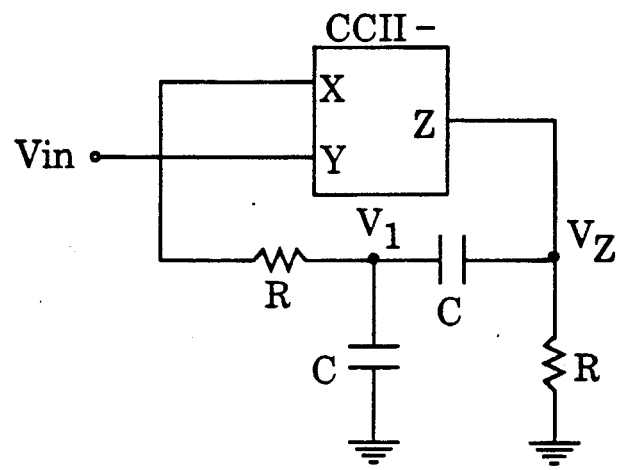
FIG. 16 shows the configuration for a low-pass filter with single CCII−.

As an example, for eqn. (42), if $y_1 = 0$ (open circuit), $y_2 = 1/R_2$, $y_3 = sC_3$, $y_4 = sC_4$, and $y_5 = 1/R_5$, shown in FIG. 16, then a low-pass filter (LPF) can be established at the node V1 with $$\omega_0 = \left(\frac{1}{C_3C_4R_2R_5}\right)^{\frac{1}{2}} \quad (45)$$

$$Q = \frac{1}{C_3 + C_4}\left(\frac{R_5}{R_2}C_3C_4\right)^{\frac{1}{2}} \quad (46)$$

and gain $= -1$ (47)

and gain $H_{HP} = -1$ (41)

By substituting the above admittances into eqn. (43). it is of interest to note that a band-pass (BP) filtering function can be obtained at node Vz. The quality factor Q and natural frequency of this BPF are the same eqns. (45) and (46). The gain of this BPF is given as $$\text{gain} = -\frac{C_3R_5}{R_2(C_3 + C_4)} \quad (48)$$

Figure 17:
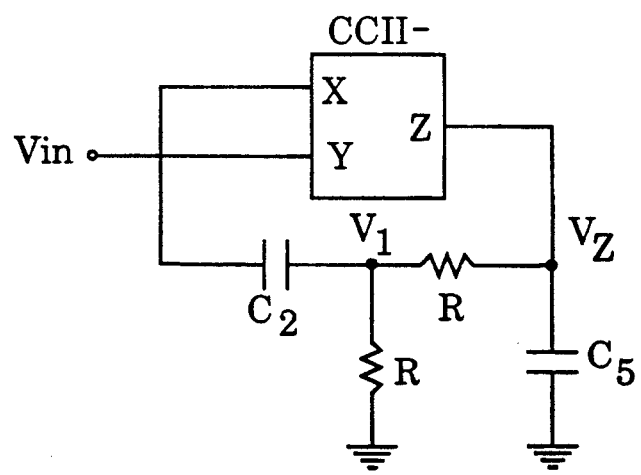
FIG. 17 shows a high-pass filter with single CCII−.

Similarly, if $y_1 = 0$, $y_2 = sC_2$, $y_3 = 1/R_3$, $y_4 = 1/R_4$, and $y_5 = sC_3$, then node V1 in the FIG. 17 behaves like a high-pass (HP) characteristic and node Vz also performs a BP filtering function. Their characteristics can be described as $$\omega_0 = \left(\frac{1}{C_2C_5R_3R_4}\right)^{\frac{1}{2}} \quad (49)$$

$$Q = \frac{1}{R_3 + R_4}\left(\frac{C_2}{C_5}R_3R_4\right)^{\frac{1}{2}} \quad (50)$$

$$\text{gain}_{HP} = -1, \text{gain}_{BP} = -\frac{C_2R_4}{C_5(R_3 + R_4)} \quad (51)$$

Therefore, this type of SCBs can provide two kinds of filtering characteristic simultaneously. The simultaneous availability of two different filtering functions makes this circuit suitable for application as a universal filter.

Further, this configuration can also provide all-pass- (AP) and notch (N) filtering functions and it is described in the following: If admittance y3 is zero (open-circuit), then eqn. (37) becomes $$\frac{V_1}{V_y} = \frac{y_1y_4 - y_2y_5}{y_5(y_2 + y_4)} \quad (52)$$

Eqn. (47) can synthesize first-order APFs which are given in Table 3. One can also simplify eqn. (46) to synthesize N filters. If $y_3 = 0$, $y_1 = y_5$, $y_4 = sC_4 + 1/R_4$, and $y_2 = 1/(R_2 + 1/sC_2)$, a second-order N filter can be constructed with $C_4 = C_2(1 - R_2/R_4)$. Its transfer function is given as $$\frac{V_1}{V_y} = \frac{s^2C_2C_4R_2R_4 + 1}{s^2C_2C_4R_2R_4 + s(C_2R_2 + C_4R_4 + C_2R_4) + 1} \quad (53)$$

Because its output is of the same magnitude as the input, this N filter has no disadvantage of having a constant loss which needs an additional amplifier in practice. Other possible realizations of the N filters are summarized in Table 4.

Another possible realization of the RC network N, shown in FIG. 14, is given in FIG. 15(b). The transfer functions with nodes V1 and V2 ion FIG. 15(b) as outputs can be obtained as $$\frac{V_1}{V_y} = \frac{y_1y_4}{y_4(y_1 + y_2 + y_3) + y_2y_3} \text{ for } CCII- \quad (54)$$

$$\frac{V_2}{V_y} = \frac{y_1 y_4}{y_4(y_1 + y_2 + y_3) + y_2 y_3} \text{ for } CCII- \quad (55)$$

According to eqns. (49) and (50), different element combinations yield useful second-order filtering networks which are summarized in the Table 5. The second configuration also provide two filtering functions simultaneously just like the first configuration.

All these filters can be implemented with CMOS integrated circuits. Although cascode current sources are illustrated here, it should be understood that other kinds of current sources, such as the simple current source, the Wilson current source, the Widlar current source, well known in the art, can also be used.

TABLE 1
Single-CCII-Biquad filter derived from the first configuration

| | | | Admittances | | |
|---|---|---|---|---|---|
| Function | $Y_1$ | $Y_2$ | $Y_3$ | $Y_4$ | $Y_5$ |
| CCII+ | | | | | |
| LP | $C_1$ | $C_2$ | $R_3$ | $R_4$ | $R_5$ |
| $BP_1$ | $R_1$ | $C_2$ | $R_3$ | $R_4$ | $C_5$ |
| $BP_2$ | $C_1$ | $R_2$ | $C_3$ | $C_4$ | $R_5$ |
| HP | $R_1$ | $R_2$ | $C_3$ | $C_4$ | $C_5$ |
| CCII− | | | | | |
| LP | $C_1$ | $C_2$ | $R_3$ | $R_4$ | $R_5$ |
| $BP_1$ | $C_1$ | $R_2$ | $C_3$ | $C_4$ | $R_5$ |
| $BP_2$ | $R_1$ | $R_2$ | $C_3$ | $C_4$ | $R_5$ |
| $BP_3$ | $C_1$ | $C_2$ | $R_3$ | $R_4$ | $C_5$ |
| $BP_4$ | $R_1$ | $C_2$ | $R_3$ | $R_4$ | $C_5$ |
| HP | $R_1$ | $R_2$ | $C_3$ | $C_4$ | $C_5$ |

TABLE 2
Transfer functions characteristics for the second configuration

| | | | Admittances | | |
|---|---|---|---|---|---|
| Function | $Y_1$ | $Y_2$ | $Y_3$ | $Y_4$ | $Y_5$ |
| CCII+ | | | | | |
| $LP_1$ | $C_1$ | $C_2$ | $R_3$ | $R_4$ | $R_5$ |
| $LP_2$ | $C_1$ | $C_2$ | $R_3$ | $C_4$ | $R_5$ |
| $BP_2$ | $R_1$ | $C_2$ | $C_3$ | $C_4$ | $R_5$ |
| $BP_3$ | $C_1$ | $R_2$ | $R_3$ | $C_4$ | $C_5$ |
| $BP_4$ | $C_1$ | $R_2$ | $R_3$ | $R_4$ | $C_5$ |
| $HP_2$ | $R_1$ | $R_2$ | $C_3$ | $C_4$ | $C_5$ |
| CCII− | | | | | |
| $LP_1$ | $C_1$ | $C_2$ | $R_3$ | $R_4$ | $C_5$ |
| $LP_2$ | $C_1$ | $C_2$ | $R_3$ | $C_4$ | $C_5$ |
| $BP_1$ | $C_1$ | $R_2$ | $C_3$ | $C_4$ | $C_5$ |
| $BP_2$ | $R_1$ | $C_2$ | $C_3$ | $C_4$ | $R_5$ |
| $BP_3$ | $R_1$ | $C_2$ | $C_3$ | $R_4$ | $R_5$ |
| $BP_4$ | $C_1$ | $C_2$ | $R_3$ | $R_4$ | $C_5$ |
| $BP_5$ | $C_1$ | $R_2$ | $C_3$ | $R_4$ | $C_5$ |
| $BP_6$ | $C_1$ | $R_2$ | $R_3$ | $C_4$ | $C_5$ |
| $HP_1$ | $R_1$ | $R_2$ | $C_3$ | $R_4$ | $C_5$ |
| $HP_2$ | $R_1$ | $R_2$ | $C_3$ | $C_4$ | $C_5$ |

TABLE 3
Two first-order allpass filters

| APF elements | Resistor | Capacitor |
|---|---|---|
| 1 | $Y_1, Y_2, Y_5$ | $Y_4$ |
| 2 | $Y_1, Y_4, Y_5$ | $Y_2$ |

TABLE 4
Second-order Notch filters derived from eqn. (52)

| NF | $y_1$ | $y_2$ | $y_3$ | $y_4$ | $y_5$ | condition |
|---|---|---|---|---|---|---|
| 1 | $\frac{1}{R}$ | $sC_2 + \frac{1}{R_2}$ | 0 | $\frac{1}{R_4 + 1/sC_4}$ | $1/R$ | $C_2 = C_4\left(1 - \frac{R_4}{R_2}\right)$ |
| 2 | $\frac{1}{R}$ | $\frac{1}{R_4 + 1/sC_4}$ | 0 | $sC_2 + \frac{1}{R_2}$ | $1/R$ | $C_2 = C_4\left(1 - \frac{R_4}{R_2}\right)$ |
| 3 | $sC$ | $\frac{1}{R_4 + 1/sC_4}$ | 0 | $sC_2 + \frac{1}{R_2}$ | $sC$ | $C_2 = C_4\left(1 - \frac{R_4}{R_2}\right)$ |
| 4 | $sC$ | $\frac{1}{R_4 + 1/sC_4}$ | 0 | $sC_2 + \frac{1}{R_2}$ | $sC$ | $C_2 = C_4\left(1 - \frac{R_4}{R_2}\right)$ |
| 5 | $sC_1 + \frac{1}{R_1}$ | $sC_2$ | $sC_3$ | $sC_4 + \frac{1}{R_4}$ | $1/R_5$ | $\frac{C_4}{R_1} + \frac{C_1}{R_4} = \frac{C_2}{R_5}$ |
| 6 | $sC_1 + \frac{1}{R_1}$ | $1/R_2$ | $sC_3$ | $sC_4 + \frac{1}{R_4}$ | $sC_5$ | $\frac{C_4}{R_1} + \frac{C_1}{R_4} = \frac{C_5}{R_2}$ |
| 7 | $sC_2$ | $sC_1 + 1/R_1$ | 0 | $\frac{1}{R_5}$ | $sC_4 + \frac{1}{R_4}$ | $\frac{C_4}{R_1} + \frac{C_1}{R_4} = \frac{C_2}{R_5}$ |
| 8 | $\frac{1}{R_5}$ | $sC_1 + \frac{1}{R_1}$ | 0 | $sC_2$ | $sC_4 + \frac{1}{R_4}$ | $\frac{C_4}{R_1} + \frac{C_1}{R_4} = \frac{C_5}{R_2}$ |

| $BP_4$ | $R_1$ | $C_2$ | $R_3$ | $R_4$ | $C_5$ |
| HP | $R_1$ | $R_2$ | $C_3$ | $C_4$ | $C_5$ |

TABLE 5
Second-order filters derived from FIG. 15(b)

| | | | admittance | | | Transfer function | |
|---|---|---|---|---|---|---|---|
| Network | $Y_1$ | $Y_2$ | $Y_3$ | $Y_4$ | $Y_5$ | $V_1$ | $V_2$ |
| 1 | $1/R_1$ | $sC_2$ | $sC_3$ | $1/R_4$ | $1/R_5$ | LP | BP |
| 2 | $sC_1$ | $1/R_2$ | $1/R_3$ | $sC_4$ | $1/R_5$ | HP | BP |

TABLE 5-continued

Second-order filters derived from FIG. 15(b)

| Network | admittance | | | | | Transfer function | |
|---|---|---|---|---|---|---|---|
| | $Y_1$ | $Y_2$ | $Y_3$ | $Y_4$ | $Y_5$ | $V_1$ | $V_2$ |
| 3 | $sC_1$ | $sC_2$ | $sC_3 + 1/R_6$ | $1/R_4$ | $1/R_5$ | BP | HP |

What is claimed is:

1. A continuous-time signal processing system using a second generation current conveyor (CCII) having X and Y input terminals, and Z output terminal with characteristics that the voltages at said X and Y terminals are equal, zero current at said Y terminal, and equal currents at said X and Z terminals, comprising:
   a differential pair of transistors, a first generation current conveyor and a first current mirror;
   said differential pair having inputs serving as said X and Y terminals and having differential outputs driving directly two inputs of said first generation current conveyor forming a voltage-to-current converter;
   said voltage-to-current converter driving said first current mirror;
   said first generation current conveyer output fed back to said X terminal;
   said first generation current conveyor comprising:
   a first p-channel MOSFET current mirror,
   an n-channel MOSFET current mirror,
   said first p-channel MOSFET current mirror and said n-channel MOSFET current mirror having inputs and outputs cross-coupled,
   drains of said p-channel MOSFETs in said first p-channel MOSFET current mirror connected to a positive power supply,
   two sources of n-channel MOSFETs in said n-channel MOSFET current mirror connected separately to two drains of two other n-channel MOSFETs used as said differential pair, and serving as inputs to said first generation current conveyor,
   a second p-channel MOSFET current mirror connected to convey an output current at said Z terminal mirroring currents at said inputs to said first generation current conveyor to function as a positive second generation current conveyor.

2. A signal processing system as described in claim 1, wherein said second p-channel MOSFET current mirror has a cascode current source.

3. A continuous-time signal processing system as described in claim 2 wherein said cascode current source source has first and second p-channel MOSFET connected in cascode,
   the gate of said first p-channel MOSFET connected to either drain of said first p-channel MOSFET in said first generation current conveyor,
   the gate of said second p-channel MOSFET connected to a voltage to operate said first p-channel MOSFET at a low drain-to-source dc voltage for effecting a high precision said current mirror.

4. A signal processing system as described in claim 3, wherein said gate of said second p-channel MOSFET is connected to one of the sources of said n-channel MOSFETs in said first generation current conveyor.

5. A signal processing system as described in claim 1, wherein said first current mirror comprises first p-channel MOSFET current source sinking into a second n-channel MOSFET current source.

6. A signal processing system as described in claim 5, wherein said first current mirror uses cascode current source.

7. A signal processing system as described in claim 1, wherein said first current mirror is a complementary current mirror comprising:
   a p-channel MOSFET current mirror,
   an n-channel MOSFET current mirror, driven by mirrored current of said p-channel MOSFET current mirror and sinking into a p-channel MOSFET current source,
   output of said n-channel MOSFET current mirror serving as said Z terminal and conveying a current equal and opposite to input current at said X terminal to function as a negative CCII.

8. A continuous-time signal processing system as described in claim 7, wherein said p-channel MOSFET current mirror uses a cascode current source.

9. A continuous-time signal processing system as described in claim 7, wherein said n-channel MOSFET current mirror uses a cascode current source.

10. A continuous-time signal processing system as described in claim 1, wherein said system uses an integrator as a building block, said integrator comprising said second generation current conveyor, a capacitor and an MOS resistive circuit (MRC),
    said MRC comprising first, second, third and fourth MOSFET, and having input voltages V1 and V2, output currents I1 and I2, and first and second control voltages,
    said first and second MOSFETs having sources connected together to said input voltage V1, gates connected to first and second gate voltages respectively, and drains connected separately to said I1 and I2 respectively of said MRC,
    said third and fourth MOSFETs having sources connected to said input voltage V2, gates connected to second and first gates voltages respectively, and drains connected to said I1 and I2 respectively of said MRC,
    said output current difference being proportional to difference of said input voltages.

11. A continuous time signal processing system as described in claim 10, wherein said system is an integrator comprising:
    said CCII,
    an MRC,
    said CCII having said X and Y input terminals driven by said output currents of said MRC,
    a feedback capacitor connected from said Z terminal of said CCII to X terminal of said CCII,
    a second capacitor with capacitance equal to one half of the capacitance of said feedback capacitor connected between said Y terminal and an ac ground.

12. A continuous-time signal processing system as described in claim 10, wherein said system is an integrator comprising:
    said CCII having said X terminal connected to a first current I1, said Y terminal connected to a second current I2,
    a capacitor connected between said Z terminal and said X terminal,
    a first MRC having first input connected to said X-terminal,
    a second MRC having first input connected to said Y terminal, an inverter with input connected to said Z terminal and output connected to second inputs of said first and second MRC, both said MRCs having two said control gate voltages applied, and having said first output terminals connected together to supply a third current, and having second said output terminals connected together to supply a fourth current, the difference between said third current and said fourth current being proportional to the integral of difference of I1 and I2.

13. A continuous-time signal processing system as described in claim 12, wherein said integrator is used as a building block comprising:

said CCII having said X terminal connected to a first current, said Y terminal connected to a second current, a capacitor connected between said Z terminal and an ac ground, a first MRC having first input connected to said X terminal, a second MRC having input connected to second inputs of first and second MRC, both said MRCs having two said control gate voltages applied and having first output terminals connected together to supply a third current, and having second output terminals connected together to supply a fourth current, the difference between said third current and said fourth current being proportional to the integral of difference of said first and said second current.

14. A continuous-time signal processing system as described in claim 10, wherein said system is a filter having equivalent resistance, capacitance and inductance, a series resistance and a capacitance section is realized by first said integrator integrating the difference between an input voltage and recursively fedback output voltage of said RC section to derive said output voltage, an inductance is realized by second said integrator integrating the voltage difference across said inductance, a parallel RC section is realized by a third said integrator, integrating the current difference between input current and the current through the resistance of said parallel RC section.

15. A continuous-time signal processing system as described in claim 10 wherein said system has a high order transfer function, comprising multiple said integrators and recursive feedback for deriving high order integration quantities to satisfy said transfer function.

16. A continuous-time signal processing system as described in claim 15, wherein said system is a sixth order low-pass filter, having series input resistance, an output load resistance, a pi network having parallel inductance and capacitance in each branch of said pi network, each said branch having second order transfer function.

17. A continuous-time signal processing system as described in claim 5, wherein said system is a filter using said second generation current conveyor (CCII) as a building block.

18. A continuous-time signal processing system as described in claim 17, wherein said filter is a biquad comprising:

said CCII, first, second, third, fourth and fifth admittances, said first admittance connected between said Y-terminal of said CCII and ac ground, said second admittance connected between said Z terminal and said Y terminal, said third admittance connected between said Z terminal and said ac ground, said fourth admittance connected between said X terminal and said ac ground, said fifth admittance connected between an input voltage and said Y terminal.

19. A continuous-time signal processing system as described in claim 17, wherein said filter is a first-order all-pass filter, comprising:

said CCII, a resistance, first capacitor and second capacitor, said resistance connected between said X terminal and an ac ground, said first capacitance connected between an input voltage and said Y terminal, said second capacitor connected said Y terminal and said Z terminal.

20. A continuous-time signal processing system as described in claim 17, wherein said filter is a notch biquad filter, comprising:

said CCII, first, second and third resistance, first, second and third capacitor, first said resistance connected between said X terminal and said first capacitor, the other end of which is ac grounded, said second resistance and said second capacitance connected between said Y terminal and said Z terminal, said third resistance and said capacitance connected between an input voltage and said Y terminal.

21. A continuous-time signal processing system as described in claim 17, wherein said filter is a band-pass biquad filter, comprising:

said CCII, first, second and third resistance, first and second capacitance, said first resistance connected said Y terminal and an ac ground, said second resistance connected between said X terminal and said ac ground, said third resistance connected between an input voltage and said Z terminal, said first capacitance connected between siad Y terminal and said Z terminal, said second capacitance connected between said Z terminal and said ac ground.

22. A continuous-time signal processing system as described in claim 17, wherein said filter is a high-pass biquad filter, comprising:

said CCII, first, second and third resistance, first and second capacitance, said first resistance connected said Y terminal and an ac ground, said second resistance connected between said Z terminal and said ac ground, said third resistance connected between said X terminal and said ac ground, said first capacitance connected between said Y terminal and said Z terminal, said second capacitance connected between said Z terminal and an input voltage.

23. A continuous-time signal processing system as described in claim 17, wherein said filter is a biquad with high input impedance, comprising:
said CCII,
a notch filter connected between said X terminal and Z terminal of said CCII,
said Y terminal of said CCII serving as input terminal.

24. A continuous-time signal processing system as degscribed in claim 17, wherein said filter is a biquad, comprising:
said CCII,
first, second, third, fourth and fifth admittance,
said first admittance connected between said X terminal and an ac ground,
said second admittance and said fourth admittance connected in series between siad X terminal and said Z terminal,
said third admittance connected between said ac ground and the junction of said second and said fourth admittance,
said fifth admittance connected between said Z terminal and said ac ground,
said Y terminal serving as input terminal.

25. A continuous-time signal processing system as described in claim 17, wherein said filter is a biquad, comprising:
said CCII,
first, second, third, fourth, and fifth admittance,
said first, third and fifth admittance connected in series between said X terminal and said Z terminal,
said second admittance connected between an ac ground and the junction between said first admittance and said third admittance,
said fourth admittance connected between said ac ground and the junction between said third admittance and said fifth admittance,
said Y-terminal serving as input terminal.

26. A continuous-time signal processing system as described in claim 17, wherein said filter is a low-pass filter, comprising:
said CCII,
first and second resistance,
first and second capacitance,
said first resistance connected at one end to said X-terminal, and at another end in series with said first capacitance to said Z-terminal,
said second capacitance connected between ground and junction of said first resistance and said first capacitance,
said second resistance connected between said Z-terminal and ground,
said Y-terminal serving as input terminal.

27. A continuous-time signal processing system as described in claim 17, wherein said filter is a high-pass filter, comprising:
said CCII,
first and second resistance,
first and second capacitance,
said first capacitance connected at one end to said X-terminal and at another end in series with said first resistance to said Z-terminal,
said second resistance connected between ground and junction of said first capacitance and said first resistance,
said second capacitance connected between said Z-terminal and ground,
said Y-terminal serving as input terminal.

* * * * *

UNITED STATES PATENT AND TRADEMARK OFFICE
CERTIFICATE OF CORRECTION

PATENT NO. : 5,124,666
DATED : June 23, 1992
INVENTOR(S) : Shen-Iuan Liu, et. al.

It is certified that error appears in the above-indentified patent and that said Letters Patent is hereby corrected as shown below:

On the Title page, item [54], delete "CONVEVOR" and substitute -- CONVEYOR--.

Signed and Sealed this

Nineteenth Day of October, 1993

*Attest:*

BRUCE LEHMAN

*Attesting Officer*      *Commissioner of Patents and Trademarks*